United States Patent [19]

Shimbo

[11] Patent Number: 4,845,046

[45] Date of Patent: Jul. 4, 1989

[54] PROCESS FOR PRODUCING SEMICONDUCTOR DEVICES BY SELF-ALIGNMENT TECHNOLOGY

[75] Inventor: Masafumi Shimbo, Tokyo, Japan

[73] Assignee: Seiko Instruments Inc., Tokyo, Japan

[21] Appl. No.: 91,609

[22] Filed: Aug. 31, 1987

[30] Foreign Application Priority Data

Sep. 2, 1986 [JP] Japan ................................ 61-206519

[51] Int. Cl.[4] ................ H01L 21/265; H01L 21/225; H01L 21/465
[52] U.S. Cl. ...................................... 437/41; 437/31; 437/29; 437/44; 437/162; 437/228
[58] Field of Search ................. 437/162, 61, 962, 147, 437/41, 228

[56] References Cited

U.S. PATENT DOCUMENTS

| | | | |
|---|---|---|---|
| 3,735,807 | 8/1973 | Hoare et al. | 437/162 X |
| 3,990,927 | 11/1976 | Montier | 437/962 X |
| 4,063,992 | 12/1977 | Hosack | 437/228 |
| 4,127,931 | 12/1978 | Shiba | 437/162 X |
| 4,148,054 | 4/1979 | Hart et al. | 437/162 X |
| 4,352,238 | 10/1982 | Shimbo | 437/162 X |
| 4,414,737 | 11/1983 | Menjo et al. | 437/228 |
| 4,481,706 | 11/1984 | Roche | 437/162 X |
| 4,531,282 | 7/1985 | Sakai et al. | 437/162 X |
| 4,545,114 | 10/1985 | Ito et al. | 437/59 |
| 4,569,119 | 2/1986 | Terada et al. | 437/228 |
| 4,670,090 | 6/1987 | Sheng et al. | 357/49 |
| 4,696,095 | 9/1987 | Thomas | 437/962 X |
| 4,728,621 | 3/1988 | Graf et al. | 437/41 |
| 4,774,206 | 9/1988 | Willer | 437/41 |

Primary Examiner—Brian E. Hearn
Assistant Examiner—Tom Thomas
Attorney, Agent, or Firm—Bruce L. Adams; Van C. Wilks

[57] ABSTRACT

A method of manufacturing semiconductor device wherein the self-alignment technique is employed to simplify the manufacturing process and includes the steps of successively depositing multiple layer masking films comprising a first, a second and a third masking films on an n-type Si region, forming an island region of the multiple layer films and a peripheral portion of the second masking film which is etched away, by side-etching, from the edges of the other masking films, selectively forming an oxidized film, selectively etching the first oxidized film using the second masking film as a mask and forming fine contact windows between the selectively formed oxidized film and the first masking film, depositing a semiconductor thin film, lifting-off the semiconductor thin film by removing the second and third masking films and leaving a portion of the semiconductor film which contacts the windows, oxidizing the surface of the semiconductor thin film and removing the first masking film.

18 Claims, 3 Drawing Sheets

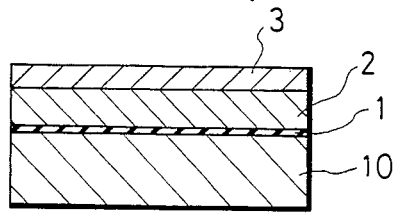
FIG.1(a)
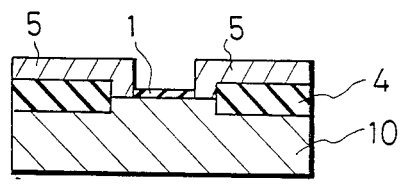
FIG.1(f)
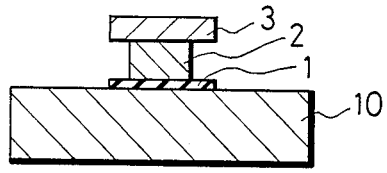
FIG.1(b)
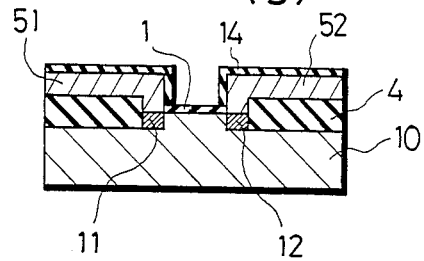
FIG.1(g)
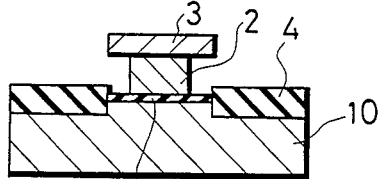
FIG.1(c)
FIG.1(h)
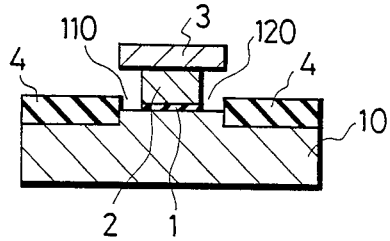
FIG.1(d)
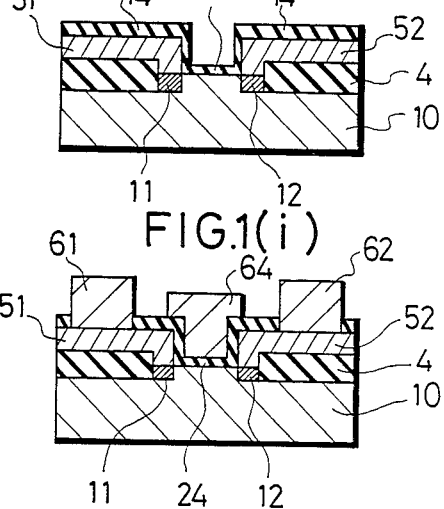
FIG.1(i)
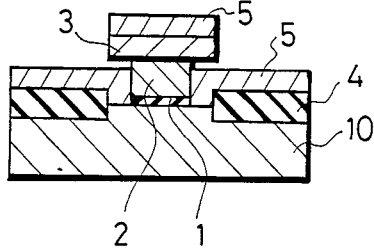
FIG.1(e)

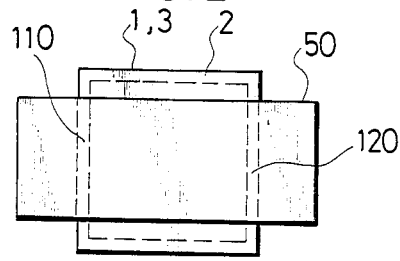
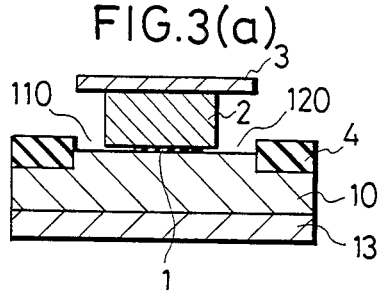
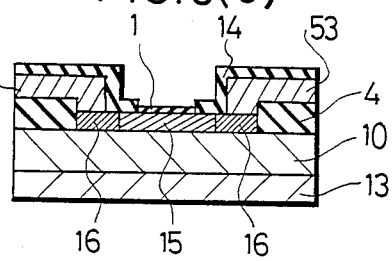
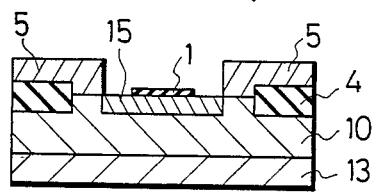
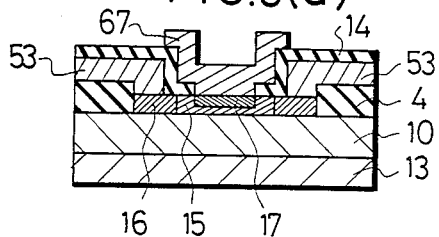
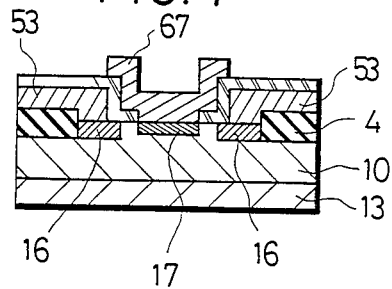

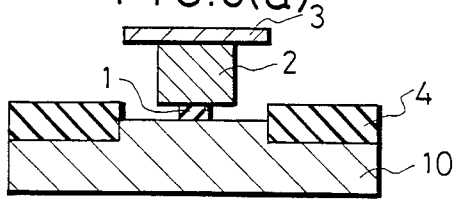
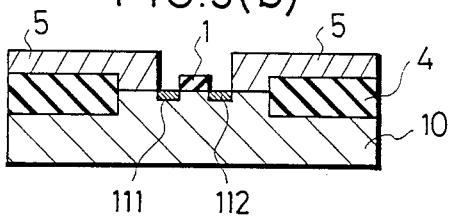
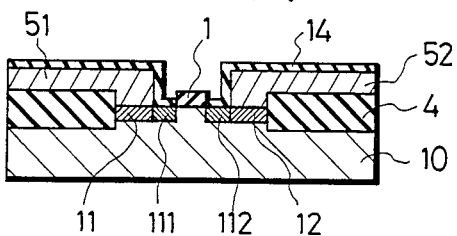
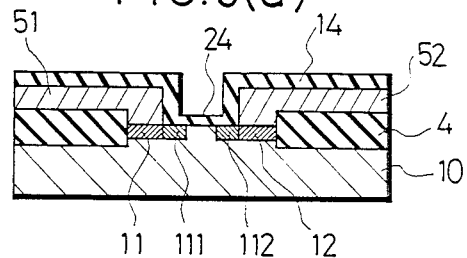
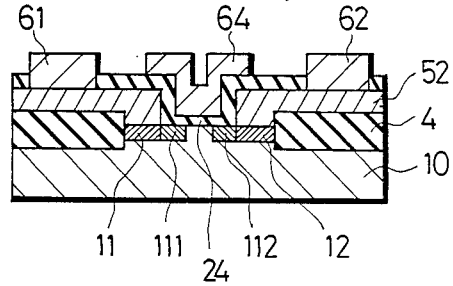
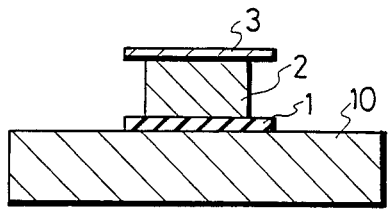
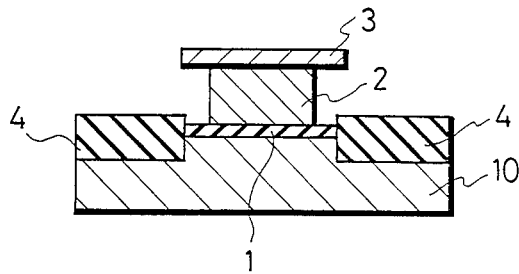

PROCESS FOR PRODUCING SEMICONDUCTOR DEVICES BY SELF-ALIGNMENT TECHNOLOGY

BACKGROUND OF THE INVENTION (a) Field of the Invention

This invention relates to the manufacturing method of semiconductor devices such as insulated gate transistors, junctioned gate field effect transistors, bipolar transistors, etc.

(b) Prior art

Further miniaturization of transistors is being promoted every year in response to increased requirements of higher speed and higher integration of devices. In this trend, the self-aligning technique is necessary, in addition to miniature processing techniques. For example, by the manufacturing method of bipolar transistors, namely Super Self-Alignment Technology, described in Electronics Letters, Volume 19, P283-P284 (issued in 1983), 30 picosec. of propagation delay time was achieved. According to this method, locations and size of p-type active base, p+ base region and n+ emitter are defined by one selective etching of polysilicon film in the size of the emitter region, and this method has an advantage that the width of the p+ base region is defined by the amount of side-etching and is very narrow. However, a significant problem with this method is that many processes, such as four polysilicon depositions and two isotropic etchings, are required. A manufacturing method related to an MOS transistor is described in Tsushin Gakkai Denshi Gijutsu Kenkyu Hokoku (Research Report of Electronics Communication Society) SSD84-101 (issued on Dec. 18, 1984). This method is named Multiple Self-Alignment MOS Transistors. However, this method still requires many processes, such as filling gaps between the substrate and side-etched polysilicon film by polysilicon, and isotropic etching.

SUMMARY OF THE INVENTION

Therefore, it is an object of this invention to provide a manufacturing method for a semiconductor device using a self-alignment technique to simplify the manufacturing process. The manufacturing process includes the steps of (1) successively depositing multiple layer masking films comprising a first, a second and a third masking films on an n-type Si region, (2) forming an island region of the multiple layer films and a peripheral portion of the second masking film which is etched away, by side-etching, from the edges of the other masking films, (3) selectively forming an oxidized film, (4) selectively etching the first oxidized film using the second masking film as a mask and forming fine contact windows between the selectively formed oxidized film and the first masking film, (5) depositing a semiconductor thin film, (6) lifting-off the semiconductor thin film by removing the second and third masking films and leaving portions of the semiconductor film which contact the contact windows, (7) oxidizing the surface of the semiconductor thin film and (8) removing the first masking film. If the semiconductor thin film is of the p-type, p+ source and drain regions for MOS are formed during the abovementioned process, and the gate oxidized film and gate electrode are formed after the step (8). Likewise, in the case of a J-FET, P+ gate region is formed and n+ source or drain region is formed after the step (8). Oxidization-resistant insulation film, e.g., an $Si_3N_4$ film is used as the first masking film; an $SiO_2$ film or a high melting point metal film (first) as the second masking film; and a high melting point metal film (second) or an Si film as the third masking film. Materials for the third and second masking films are so selected that the form of the third masking film does not change against etching of the the second masking film during the abovementioned step (2), selective oxidation during the step (3) and etching of the first masking film during the step (4), and that the form of the second masking film does not change against selective oxidation during the step (3) and etching of the first masking film during the step (4). The third masking film plays a role to facilitate a lift-off operation during the step (6). The selective oxidation process in the abovementioned step (3) does not cause any problems if polysilicon is used. The region of the fine windows formed during the step (5) is defined by the amount of side-etching of the second masking film during the step (2) and can be controlled in a similar way as in conventional techniques. According to this invention, deposition of polysilicon can be completed in one or two steps.

BRIEF DESCRIPTION OF THE DRAWINGS

FIGS. 1 (a)-(i) are sectional views of MOST successively shown in the order of the manufacturing process according to the present invention, FIG. 2 illustrates a top view of MOST manufactured according to the present invention, FIGS. 3 (a)-(d) illustrate, in sectional views, the manufacturing process in which the present invention is incorporated into a bipolar process.

FIG. 4 is a sectional view of a Static Induction Transistor manufactured according to the present invention, FIGS. 5 (a)-(e) illustrate, in sectional views, the manufacturing process of MOST wherein the present invention is applied, and FIGS. 6 (a) and (b) are sectional views of still another embodiment according to the present invention.

DESCRIPTION OF THE PREFERRED EMBODIMENTS a. Embodiment 1, Manufacturing process for MOST (FIG.1 and FIG.2)

FIGS.1 (a) to (i) illustrate one embodiment in which this invention is applied to the manufacturing process of an MOS Transistor.

FIG.1(a) illustrates the step in which a first masking film (SiN film) 1, a second masking film ($SiO_2$) 2, a third masking film (Ta film) are successively deposited on an n-type Si substrate 10. The deposition is carried out by CVD, sputtering, etc. The thickness of the first masking film 1, second masking film 2 and third masking film 3 are respectively, e.g., O.1 $\mu$m, 1 $\mu$m and 0.2 $\mu$m.

FIG.1(b) is a sectional view showing the step in which the multiple layer film is left as an island region in approximately the size of the MOST. After the multiple layer film has been almost vertically etched by Reactive Ion Etching (RIE), Ion etching, etc., the second masking film 2 is side-etched by isotropic etching such as plasma etching, wet etching, etc. The undercut by side-etching is, e.g., 0.5 $\mu$m-1 $\mu$m.

FIG.1(c) is a sectional view showing the step in which an oxidized film 4 is selectively formed using the first masking film as a mask. It is possible to form concaved portions in the substrate 10 in advance in order to reduce the bird's beaks which appear during selective etching. The selectively oxidized film 4 is formed in the thickness of e.g., 1 μm–2 μm.

FIG.1(d) is a sectional view showing the step in which area of the first masking film adjacent to the edge of the second masking film are removed using the second masking film 2 as a mask, and during this step, contact windows 110 and 120 of fine strip on the surface of the substrate 10 are formed between the first masking film 1 and selectively oxidized film 4. Isotropic etching is used to remove the first masking film 1.

FIG.1(e) is a sectional view showing the step in which a Boron-doped amorphous silicon film 5 is deposited. As isotropic deposition is desired for the deposition of the a-Si film 5, a deposition technique such as chemical vapor deposition, sputtering, evaporation, ion beam deposition, etc. is used. The thickness of the a-Si film 5 is to be less than that of the second masking film 2 and first masking film 1 combined and also to be sufficient so that pin-holes do not appear. Conditions for the deposition are to be so decided that the a-Si film 5 reaches the sides of the first and second masking films 1 and 2 under the third masking film 3.

FIG.1(f) illustrates, in a sectional view, the step in which the second and third masking films, especially the second masking film, are removed by etching such as wet etching, etc., and the a-Si film 5 on the third masking film is lifted-off. During this step, the first masking film is exposed and the a-Si film 5 filling the fine windows 110 and 120 are left contacting the substrate 10. After this process, if required, unnecessary portions of the a-Si film 5 can be removed to form a source electrode 51 and a drain electrode 52.

FIG.1(g) is a sectional view showing the step in which the a-Si film 5 is oxidized at the top and side surfaces thereof to form an $SiO_2$ film 14. During this step, the a-Si film 5 becomes p+ polysilicon film, and at the same time, a p+ source region 11 and a p+ drain region 12 are formed in the substrate 10 by diffusion.

FIG. 1(h) shows a step in which a gate insulation film 24 is provided after the first masking film has been removed.

FIG.1(i) shows a sectional view in which a gate electrode 64 is formed. If required, contact windows can be formed in the $SiO_2$ film 14 to provide source and drain wirings 61 and 62.

After the step shown in FIG.1(g), an insulator film can be deposited over the whole surface, and by isotropic etching, the insulator film at the vertical side can be thickly formed and the first masking film can be exposed. During manufacturing of MOST, a masking operation is required since the p+ source region 11 and drain region 12 should be separately formed. As shown in FIG. 2, since the p+ source region 11 and drain region 12 are formed along the two opposite sides of the first, second and third masking films, openings 110 and 120 are formed by using a mask 50 in the step shown in FIG.1(d). Area outside of the mask 50 is covered by resist or the like. It is also possible that instead of using the mask 50 during the step shown in FIG.1(d), a reversal mask of the mask 50 is used to remove unnecessary portion of the a-Si film 5 after the step shown in FIG.1(f), and simultaneously to form source and drain electrodes 51 and 52. Impurity doping to the a-Si film 5 can be executed at any of the steps shown in FIG.1 (d), (e), (f) or (g). However, since impurity doping has certain relationships with separation of source and drain electrodes such as above 51 and 52, an optimum method is chosen in consideration of such relationships.

b. Embodiment 2. Manufacturing process for Bipolar (FIG.3)

FIGS.3(a) to (d) illustrate one embodiment in which this invention is applied to the manufacturing process of a bipolar transistor. FIG.3(a) illustrates, in a sectional view, the step in which fine windows 110 and 120 are formed between a first masking film 1 and a selectively oxidized film 4 in the similar manner as described in the Embodiment 1 (FIG.1(d)).

In this embodiment, prolonged side-etching of the first masking film 1 is executed using a second masking film as a mask, and an n-type region 10 is formed over an n+ type collector region 13.

FIG.3(b) illustrates the step in which the second and third masking films 2 and 3 are removed after deposition of a p+ a− Si film 5, then a p base region 15 is formed in the n type region 10 by ion implantation.

FIG.3(c) shows the step in which after removing unnecessary portions of the p+ a− Si film, p+ poly-Si base electrode 53 and p+ base region 16 are formed by diffusion. An $SiO_2$ film 14 is also formed on the p base region 15 which has been exposed by side-etching of the first masking film during the step shown in FIG.3(a).

FIG.3 (d) shows, in a sectional view, the step in which an n+ poly-Si emitter electrode 67 and an n+ emitter region 17 are formed through diffusion removal of the first masking film 1 and deposition and selective etching of the n+ poly-Si film.

As shown in this embodiment, by over-etching of the first masking film 1 using the second masking film 2 as a mask, the size of the first masking film 1 can be made small, consequently the capacitance between the n+ emitter region 17 and the p+ base region can be decreased and the breakdown voltage can be raised.

c. Embodiment 3. SIT (Static Induction Transistor) Structure (FIG.4)

If the formation of the p base region 15 by ion implantation as shown in FIG.3(b) is not executed and if the size and impurity concentration thereof are properly chosen, an SIT as shown in FIG. 4 can be obtained in a similar process as shown in FIG. 3. This method applies not only to an SIT but also to a J-FET.

d. Embodiment 4. MOST manufacturing process (FIG. 5) FIGS.5 (a) to (e) illustrate the process in sectional views in which this invention is applied to a MOST having the Lightly Doped Drain (LDD) structure.

FIG.5(a) illustrates the step in which a first masking film 1 is side-etched over the periphery of a second masking film in a similar manner as shown in FIG.3.(a).

FIG.5(b) illustrates a sectional view wherein, by using a p+ a− Si film 5 and the first masking film 1 as masks, p− regions 111 and 112 are formed on the n substrate surface between these films. During the steps shown in FIGS. 5(c) and (d), the same processes as shown in FIG.1 are executed, and a MOST having the LDD structure as shown in FIG.5(e) is obtained.

e. Embodiment 5. Third masking film (FIG.6) FIGS.6(a) to (b) show an example in which a a-Si or a poly-Si film is used as the third masking film 3.

FIG.6(a) illustrates a sectional view wherein the first, second and third masking films 1, 2 and 3 are left as an island region.

FIG.6(b) illustrates a sectional view in which selectively oxidized film 4 is formed. During this step, the Si film, which is the third masking film, changes to $SiO_2$ film. As the thickness of the film increases during this step, over-hang of the third masking film relative to the second masking film 2 increases and it facilitates a lift-off operation executed at later stage.

(Effect according to this invention)

As described hereinabove, in the process according to this invention, source region 11 and drain region 12 of a MOST and p+ base region 16 of a bipolar can be defined by the extent of side-etching of second masking film 2. Therefore they can be formed extremely thin. Because of this feature, a very small size transistor with high-speed performance can be obtained, and the manufacturing process can be simplified as described hereinabove. Although the present invention has been described with reference to an embodiment in which a-Si film is used for semiconductor thin film 5, poly-Si film can also be used and it can also be applied to double-layer structure which is composed of semiconductor film and metal having conductive impurity, as well as to triple-layer structure which is composed of semiconductor film—metal—semiconductor film. While the invention has also been described with reference to another embodiment in which $SiO_2$ is used for second masking film 2, metal and other insulation films can also be used. Similarly, metal, Si film and other insulation films can be used for third masking film 3. High melting point metals such as Ta, W, Mo, etc., and silicides of these metals can be used as metal films. In addition to the abovementioned embodiments, the present invention can be applied to lateral type devices J-FET, SIT, bipolar as well as Schottky-gate type. Its application extends not only to Si but also to other semiconductor materials such as GaAs, etc. In this case, selective oxidization is replaced with isotropic deposition of an insulator using the third masking film as a mask.

I claim:

1. A process for producing a semiconductor device comprising:
   a first step of depositing a multiple-layer masking film having a first oxidation-resistant masking film, a second masking film and a third masking film on the surface of one conduction-type low impurity concentration semiconductor region;
   a second step of patterning said multiple-layer masking film in an island region and over-etching said second masking film;
   a third step of selectively forming an oxidized film on the surface of said low impurity concentration semiconductor region using said first masking film as a mask;
   a fourth step of selectively removing said first masking film using said second masking film as a mask to provide exposed portions on said low impurity concentration semiconductor region between side edges of the remaining first masking film and the selectively formed oxidized film;
   a fifth step of depositing a thin semiconductor film in a layer thinner than the combined thickness of said second masking film and first masking film;
   a sixth step of removing said second and third masking films together with said thin semiconductor film deposited over said third masking film by lift-off to expose said first masking film and to selectively leave said thin semiconductor film in contact with said exposed portion of said low impurity concentration region;
   a seventh step of oxidizing the surface of said thin semiconductor film; and
   an eighth step of removing said first masking film and exposing said low impurity concentration region.

2. A process for producing a semiconductor device according to claim 1; wherein said fifth step comprises a step of doping said thin semiconductor film with an opposite conductive impurity of a first concentration to later form opposite conductivity regions with said opposite conductive impurity by thermal diffusion in said low impurity concentration region exposed in said fourth step.

3. A process for producing a semiconductor device according to claim 2; further comprising steps of forming two separated exposed portions opposed to each other in said low impurity concentration region by masking in said fourth step, thermally diffusing said opposite conductive impurity from said thin semiconductor film into said two separated exposed portions to form a source region and a drain region in said seventh step, providing a gate insulation film on the surface of said low impurity concentration region exposed in said eighth step, and providing a gate electrode on said gate insulation film.

4. A process for producing a semiconductor device according to claim 2; further comprising steps of providing before said first step a region of one conduction-type high impurity concentration under said one conduction-type low impurity concentration region, and providing after said eighth step on conduction-type source region at said exposed portion in said low impurity concentration region, wherein said opposite conduction region serves as a gate region and said one conduction-type high impurity concentration region serves as a drain region.

5. A process for producing a semiconductor device according to claim 2; further comprising steps of providing before said first step a region of one conduction-type high impurity concentration serving as a collector region under said one conduction-type low impurity concentration region, forming on completion of said sixth step a base region by ion-implantation of an opposite conductive impurity of concentration lower than said first concentration in said one conduction-type low impurity concentration region under said first masking film, and providing, after said eighth step, an emitter electrode of one conduction-type high impurity concentration over said base region and one conduction-type emitter region in said base region by thermally diffusing one conduction-type impurity from said emitter electrode.

6. A process for producing a semiconductor device according to claim 3; further comprising a step of over-etching said first masking film when said first masking film is selectively removed in said fourth step.

7. A process for producing a semiconductor device according to claim 4; further comprising a step of over-etching said first masking film when said first masking film is selectively removed in said fourth step.

8. A process for producing semiconductor device according to claim 5; further comprising a step of over-etching said first masking film when said first masking film is selectively removed in said fourth step.

9. A process for producing a semiconductor device according to claim 3; wherein said first masking film is silicon nitride film, the second masking film is one of silicon oxide and a first metal film and the third masking film is one of a second metal film different from first metal film and a silicon film.

10. A process for producing a semiconductor device according to claim 4; wherein said first masking film is silicon nitride film, the second masking film is one of silicon oxide and a first metal film and the third masking film is one of a second metal film different from first metal film and a silicon film.

11. A process for producing a semiconductor device according to claim 5; wherein said first masking film is silicon nitride film, the second masking film is one of silicon oxide and a first metal film and the third masking film is one of a second metal film different from first metal film and a silicon film.

12. A process for producing a semiconductor device according to claim 2; further comprising:
steps of selectively masking unnecessary portions of said thin semiconductor film and thermally diffusing said opposite conductive impurity from said thin semiconductor film to form a source region and a drain region in said seventh step, providing a gate insulation film on the surface of said low impurity concentration region exposed in said eighth step, and providing a gate electrode on said gate insulation film.

13. A process for producing a semiconductor device according to claim 12; further comprising a step of over-etching said first masking film when said first masking film is selectively removed in said fourth step.

14. A process for producing a semiconductor device according to claim 12; wherein said first masking film is silicon nitride film, the second masking film is one of silicon oxide and a first metal film and the third masking film is one of a second metal film different from first metal film and a silicon film.

15. A process for producing a semiconductor device comprising the steps of:
a. depositing a multi-layer film on the surface of a one conduction-type low impurity concentration semiconductor region, the multi-layer film including a first oxidation-resistant masking layer on the surface, a second masking layer on the first layer and a third layer on the second layer;
b. forming the multi-layer film into an island with the second layer having an area smaller than that of the first and third layers;
c. forming an oxidized film on the surface using the first layer as a mask;
d. removing portions of the first layer from the surface using the second layer as a mask to expose portions of the surface between the oxidized film and the remaining first layer;
e. depositing a semiconductor layer over the entire surface and having a thickness less than the thickness of the combined first and second layers;
f. removing the second and third layers along with the semiconductor layer thereon to expose the remaining first layers;
g. oxidizing the surface of the semiconductor layer; and
h. removing the remaining first layer to expose the surface thereunder.

16. The process according to claim 15; wherein the step e further comprises doping the semiconductor layer with an opposite conductive-type impurity than that of the semiconductor region.

17. The process according to claim 16; wherein step d comprises exposing two portions of the surface on opposite sides of the island and thereafter diffusing the opposite conductive impurity into the two exposed portions to form source and drain regions and forming a gate insulation layer on the exposed surface in step h.

18. The process according to claim 15; wherein step d includes removing portions of the first layer under the second layer.

* * * * *